United States Patent [19]
Akiyama et al.

[11] Patent Number: 5,602,782
[45] Date of Patent: Feb. 11, 1997

[54] PIPELINE-OPERATING TYPE MEMORY SYSTEM CAPABLE OF READING DATA FROM A MEMORY ARRAY HAVING DATA WIDTH LARGER THAN THE OUTPUT DATA WIDTH

[75] Inventors: Noboru Akiyama, Katsuta; Yuji Yokoyama, Ome; Tatsuyuki Ohta, Niigata; Kunihiko Suzuki, Hitachi; Yutaka Kobayashi, Katsuta, all of Japan

[73] Assignee: Hitachi, Ltd., Tokyo, Japan

[21] Appl. No.: 467,276

[22] Filed: Jun. 6, 1995

Related U.S. Application Data

[62] Division of Ser. No. 35,651, Mar. 23, 1993.

[30] Foreign Application Priority Data

Mar. 23, 1992 [JP] Japan .................................. 4-065039

[51] Int. Cl.[6] .................................................. G11C 7/00
[52] U.S. Cl. .............................. 365/189.05; 365/230.08; 365/233.5; 365/193; 365/238.5; 365/189.02
[58] Field of Search ...................... 365/189.05, 230.08, 365/233.5, 193, 238.5, 189.02, 230.02; 364/231.8; 395/425

[56] References Cited

U.S. PATENT DOCUMENTS

4,685,088  8/1987  Iannucci ........................ 365/189.02

Primary Examiner—David C. Nelms
Assistant Examiner—Andrew Q. Tran
Attorney, Agent, or Firm—Antonelli, Terry, Stout & Kraus, LLP

[57] ABSTRACT

A pipeline-operating type memory system is arranged to have a first input unit for receiving a selector address signal for selecting data, a second input unit for receiving at least an address strobe signal, an X address signal and a Y address signal for selecting data; a first unit for receiving the X address signal and the Y address signal, latching these signals utilizing a first clock signal, and continuously outputting at least either of the X and the Y address signals until these address signals are unlatched; and a second unit for latching a selector address data signal output from the first input unit utilizing the first clock signal, and continuously and selectively outputting at least either of the address signal until the signal is unlatched. The memory system operates to transfer data in a manner to suit the pipeline operating cycle at a normal operating mode and at a fast page mode.

4 Claims, 6 Drawing Sheets

PIPELINE-OPERATING TYPE MEMORY SYSTEM CAPABLE OF READING DATA FROM A MEMORY ARRAY HAVING DATA WIDTH LARGER THAN THE OUTPUT DATA WIDTH

This application is a Division of application Ser. No. 08/035,651, filed Mar. 23, 1993.

BACKGROUND OF THE INVENTION

The present invention relates to a pipeline-operating type memory system, and more particularly to the pipeline-operating type memory system which may be adaptively suitable if the number of data pieces read from a memory array is larger than the number of output bits.

In general, a pipeline-operating type signal processing means have been frequently used in a logic (Large Scaled Integration) configuring a microprocessor or the like. The application of such a means into a memory LSI for configuring a high-performance memory has been disclosed in the U.S. Pat. No. 4,685,088. This Patent specification discloses that one piece of data for a column address is selected from all the data held in the latch circuit by a multiplexor. That is, the description is oriented to a function of selecting a column.

SUMMARY OF THE INVENTION

It is an object of the present invention to provide a pipeline-operating type memory system which provides the capability of performing a multi-bit test for quite a short time and easily realizing several kinds of multi-bit output arrangements.

According to the first aspect of the invention, a pipeline-operating type memory system arranged to alternately set a latch unit to a latching state or a through state in a manner suit to a pipeline operating cycle at a normal operating mode for transferring the data for any X or Y address and to output at least one predetermined data piece, includes a first input unit for receiving a selector address signal for selecting data; a second input unit for receiving at least an address strobe signal, an X address signal and a Y address signal, both of the latter two being for selecting data; a first unit for latching the X and Y address signals by means of a first signal and continuously feeding at least one data selected by at least the X and Y address signals until the X and Y address signals are unlatched; and a second unit for latching a selector address data signal from the first unit by means of the first signal, latching the data output from the first input unit and the selector address data signal from the first input unit by means of a second signal, and continuously and selectively feeding at least the data until those data are unlatched.

As another configuration, the pipeline-operating type memory system may include a first input unit for receiving a selector address signal for selecting data; a second input unit for receiving at least an address strobe signal, an X address signal and a Y address signal, both of the latter two being for selecting data; a first unit for receiving the X and the Y address signals, latching the X and Y address signals by means of a first signal, and continuously feeding at least one data selected by at least the X address signal and the Y address signal until the X and Y address signals are unlatched; a second unit for latching a selector address data signal output from the first input unit by means of the first signal, latching the data output from the first unit and the selector address data signal from the first input unit by means of the second signal, and continuously feeding the data until those data are unlatched; and a selector for temporarily holding the data from the second unit, being selectively activated according to an operating cycle of the address strobe signal and the number of bits contained in the selector address data signal output from the first input unit, and outputting the data As another configuration, the pipeline-operating type memory system may include a first input unit for receiving a selector address signal for selecting data; a first unit for latching the selector address data signal output from the first input unit by means of a first signal, latching the selector address data signal output from the first input unit by means of a second signal, and continuously feeding the selector address data signal output from the first input unit until the data is unlatched, a second input unit for receiving at least an address strobe signal, an X address signal and a Y address signal; a second unit for receiving the X address signal and the Y address signal, latching the X and Y address signals and continuously feeding at least one piece of data selected by the X and the Y address signals until the X and Y address signals are unlatched; a third unit for latching the data from the second unit by means of the second signal and continuously feeding the data until the data is unlatched; and a selector for temporarily holding the data from the third unit, being selectively activated according to the pipeline operating cycle and the number of bits contained in the selector address data signal output from the first unit, and outputting the data.

As another configuration, the pipeline-operating type memory system may include a first input unit for receiving a selector address signal for selecting data; a first unit for latching the selector address data signal from the first input unit by means of a second signal and outputting the selector address data signal until the data signal is unlatched; a second input unit for receiving at least an address strobe signal, and an X and a Y address signal for selecting data; a second unit for receiving the X and the Y address signals, latching those X and Y address signals by means of a first signal and continuously feeding at least one piece of data selected by the X and Y address signals until the signals are unlatched; a third unit for latching the data from the second unit by means of the second signal and continuously feeding the data until the data is unlatched; and a selector for temporarily holding the data from the third unit, being selectively activated according to the pipeline operating cycle and the number of bits contained in the selector address data signal output from the first unit, and outputting the data.

As another configuration, the pipeline-operating type memory system may include a first input unit for receiving a selector address signal for selecting data; a first latch unit for latching the selector address signal by means of a first signal and continuously feeding the signal from the first input unit until the selector address signal is unlatched; a second latch unit for receiving the selector address data signal from the first latch signal, latching the signal by means of a second signal, and continuously feeding at least the selector address data signal from the first input unit until the signal is unlatched; a second input unit for receiving at least an address strobe signal, an X address signal and a Y address signal, both of the latter two being for selecting data; a third latch unit for receiving the X and the Y address signals, latching those signals by means of the first signal and continuously feeding the address data for the X and the Y address signals until those X and Y address signals are unlatched; a memory array for storing predetermined data and outputting at least one data selected by the address data; a fourth latch unit for latching the data by means of a second clock signal, and continuously feeding the data until the clock signal is unlatched; and a selector for temporarily holding the data from the fourth latch unit, being selectively activated according to a selecting signal for a pipeline operating mode and the number of bits contained in the selector address data signal, and outputting the data.

According to a second aspect of the invention, a pipeline-operating type memory system arranged to fix at least an X address, alternately setting a latch unit into a latching state or a through state in a manner to suit to a pipeline operating cycle of a rapid page operating mode for transferring any Y address in response to an address strobe signal, and to output at least one piece of data, includes a first input unit for receiving a selector address signal for selecting data; a first unit for latching the selector address data signal output from the first input unit by means of a first signal, controlling the latching state according to a control signal generated on the address strobe signal, latching the selector address data signal by means of a second signal, and continuously feeding the selector address signal until the signal is unlatched; a second input unit for receiving at least the address strobe signal and an X address signal and a Y address signal, both of the latter two being for selecting data; a second unit for receiving the X and the Y address signals, latching these signals by means of a first signal, and continuously feeding at least one data selected by the X and the Y address signals; a third unit for latching the data from the second unit by means of the second signal and continuously feeding at least data until the data is unlatched; and a selector for temporarily holding the data from the third unit, being selectively activated according to the pipeline operating cycle and the number of bits contained in the selector address data signal output from the first unit, and outputting the data.

In the abovementioned pipeline-operating type memory system, the first and the second signals are allowed to be received outside of the memory system. In place, the first and the second signals are allowed to be received from the first and the second signal units contained in the memory system. The first signal unit may be an address transition detector for feeding the first signal each time the selector address signal changes. It is included in the second unit.

The address strobe signal includes an X address strobe signal $\overline{RAS}$ and a Y address strobe signal $\overline{CAS}$. The X address strobe signal changes at each pipeline operating cycle. The Y address strobe signal $\overline{CAS}$ independently changes between the changes of the X address strobe signal.

Each number of the first latch unit, the second latch unit, the fourth latch unit and the selector is any number equal to the number of bits contained in the selector address data signal output from the first input unit. The first latch unit and the third latch unit operate within a predetermined time which is shorter than the pipeline operating cycle in response to the first signal.

The first unit includes an address transition detector for feeding the first signal each time the selector address signal changes; a mode switching circuit for feeding a first control signal and a second control signal in response to the address strobe signal; a first latch circuit for latching a selector address signal by means of the first signal, and continuously feeding at least the selector address data signal until the signal is unlatched; and a second latch circuit for latching the selector address data signal from the first latch circuit by means of the second signal and continuously feeding at least the selector address data signal until the signal is unlatched.

The mode switching circuit serves to receive the X address strobe signal $\overline{RAS}$ and the Y address strobe signal $\overline{CAS}$ and generate the second signal from those strobe signals.

The X address strobe signal $\overline{RAS}$ is held low at a rapid page operating mode. The Y address strobe signal $\overline{CAS}$ changes at each pipeline operating cycle.

The pipeline-operating type memory system arranged as above is capable of directly performing a multi-bit test when carrying out a logic test. This leads to reduction of the time necessary for the logic test. Further, when producing a newly requested pipeline-operating type memory system having a different number of output bits or output data pieces, it is possible to eliminate the troublesome work of designing a new decoder or bit line selecting switch for the requested number of output bits.

DESCRIPTION OF THE PREFERRED EMBODIMENTS

The description will be oriented to an embodiment of the present invention in referring to the drawings.

Figures 1A, 1B:
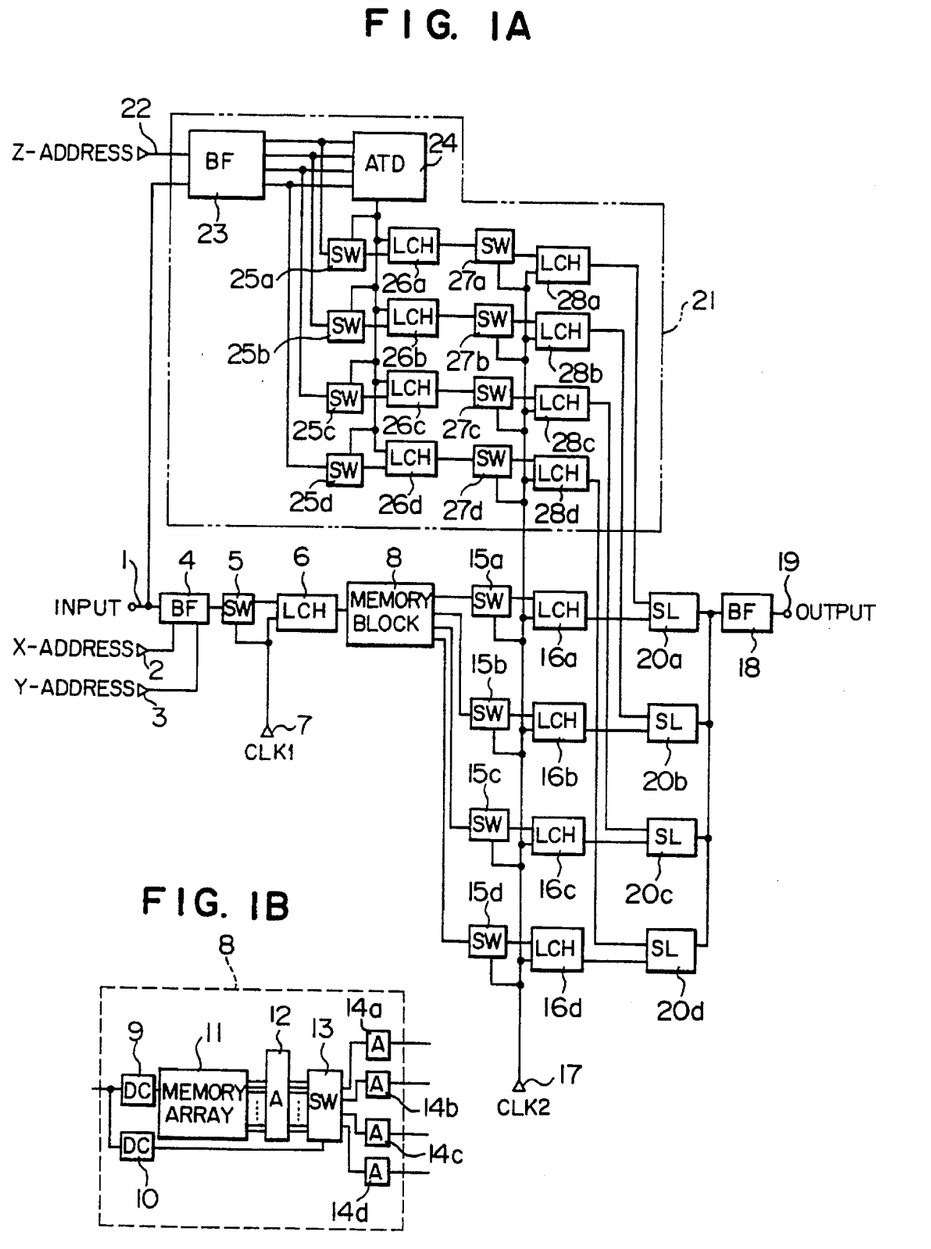
FIG. 1A is a block diagram showing a pipeline-operating type memory system according to a first embodiment of the present invention.
FIG. 1B is a diagram showing a memory block shown in FIG. 1A in detail.

In FIGS. 1A and 1B, a numeral 1 denotes an input terminal for a control signal. A numeral 2 denotes an input terminal for a row (X) address signal. A numeral 3 denotes an input terminal for a column (Y) address signal. A numeral 4 denotes an input buffer circuit. A numeral 5 denotes a switch circuit. A numeral 6 denotes a latch circuit. A numeral 7 denotes an input terminal for a first clock signal. A numeral 8 denotes a memory circuit block. A numeral 9 denotes a row (X) decoder. A numeral 10 denotes a column (Y) decoder. A numeral 11 denotes a memory array. A numeral 12 denotes a sense amplifier. A numeral 13 denotes a switch for selecting a bit line. Numerals 14a to 14d denote buffer amplifiers. Numerals 15a to 15d denote switch circuits. Numerals 16a to 16d denote latch circuits. A numeral 17 denotes an input terminal for a second clock signal. A numeral 18 denotes an output buffer circuit. A numeral 19 denotes a data output terminal. In the following description, the row address, the row decoder, the column address and the column decoder will be referred to as an X address, an X decoder, a Y address and a Y decoder, respectively.

At the control signal input terminal 1, there are applied some control signals such as a Row (X) Address Strobe Signal $\overline{RAS}$, a Column (Y) Address Strobe Signal $\overline{CAS}$, an Output Enable Signal $\overline{OE}$, and a Write Enable Signal $\overline{WE}$. To make the illustration clear, Just one control input signal terminal 1 is shown in FIG. 1A. In actuality, however, two or more control input signal terminals 1 are provided. At the X address input terminal 2, an X address signal is applied. At the Y address input terminal 3, a Y address signal is applied. At the first clock signal input terminal 7, a first clock signal CLK1 is applied. At the second clock signal input terminal 17, the second clock signal CLK2 is applied. The memory circuit block 8 following the latch circuit 6 is made up of the X decoder 9, the Y decoder 10, the memory array 11, the sensor amplifier 12, the bit line selecting switch 13 and the buffer amplifiers 14a to 14d.

In FIG. 1A, numerals 20a, 20b, 20c, 20d denote data selectors. A numeral 21 denotes a data select address (Z address) control circuit. A numeral 22 denotes a Z address signal input terminal. A numeral 23 denotes an input buffer circuit. A numeral 24 denotes a Z address transition detector circuit. Numerals 25a, 25b, 25c, 25d denote switch circuits. Numerals 26a, 26b, 26c, and 26d denote latch circuits. Numerals 27a, 27b, 27c, and 27d denote switch circuits. Numerals 28a, 28b, 28c, and 28d denote latch circuits.

The output side of the bit line select switch 13 is connected to a plurality of, herein, four buffer amplifiers 14a to 14d which are connected to the switch circuits 15a to 15d, the latch circuits 16a to 16d and the data selectors 20a to 20d, respectively. The outputs of the data selectors 20a to 20d are commonly connected to the output buffer circuit 18. The Z address control circuit 21 is made up of the input buffer circuit 23, the ATD circuit 24, the switch circuits 25a to 25d and 27a to 27d, the latch circuits 26a to 28d and 28a to 28d. At the input terminal 22 for a Z address signal, there is applied a Z address signal.

According to this embodiment, the Z address signal consists of two bits. The combination of 1 and 0 states of these bits provides four kinds of Z address data ZAD.

Figure 2:
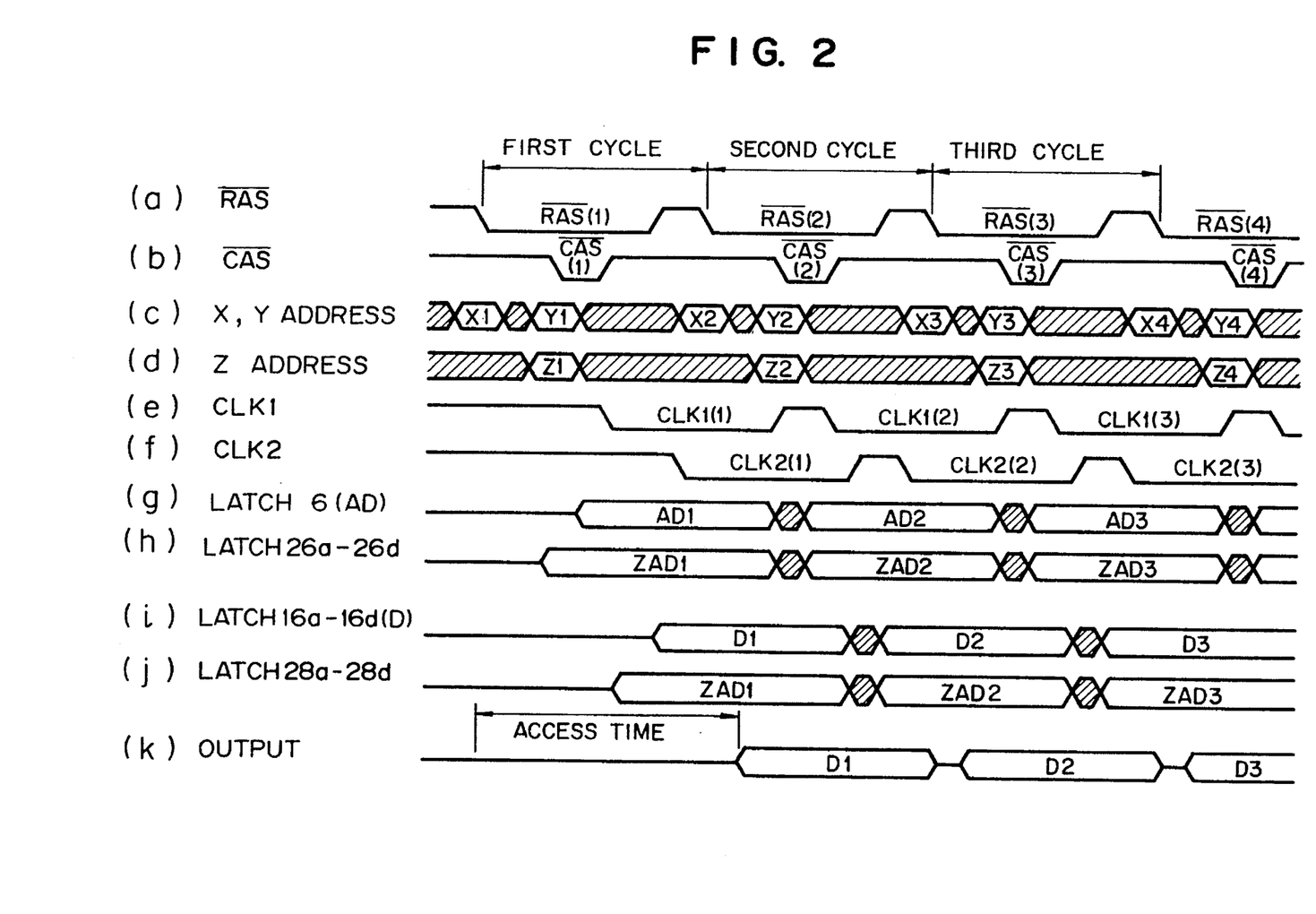
FIG. 2 is a waveform view showing how the pipeline-operating type memory system according to the first embodiment operates at a normal operating mode.

FIG. 2 is an explanatory view showing signal states and signal-feeding timings for the parts in the first embodiment.

In FIG. 2, (a) indicates a waveform of the X address strobe signal $\overline{RAS}$. (b) indicates a waveform of the Y address strobe signal $\overline{CAS}$. (c) indicates a data state of the X and Y address signals. (d) indicates a data state of the Z address signal. (e) indicates a waveform of the first clock signal CLK 1. (f) indicates a waveform of the second clock signal CLK 2. (g) indicates an address data in the latch circuit 6. (h) indicates a Z address data in the latch circuits 26a to 26d. (i) indicates data in the latch circuits 16a to 16d. (j) indicates Z address data in the latch circuits 28a to 28d. (k) indicates output data from the output terminal 19.

The X address strobe signal $\overline{RAS}$ and the second clock CLK 2 change similarly in synchronism to a pipeline operating cycle of the memory system according to the first embodiment. At the strobe of the operating cycle, those signals are in the set (low-level) state. Near the end of the operating cycle, those signals are in the reset (high-level) state. The Y address strobe signal $\overline{CAS}$ and the first clock signal CLK 1 also change in synchronism with the operating cycle. Unlike the signals $\overline{RAS}$ and CLK 2, the Y address strobe signal $\overline{CAS}$ is in the set (low-level) state only during the middle of the one operating cycle and in the reset (high-level) state during the remaining of the operating cycle. The clock signal CLK 1 is in the reset (high-level) state only during the middle of one operating cycle and in the set (low-level) state during the remaining of the operating cycle.

Herein, the operation of the first embodiment will be described as referring to FIGS. 2(a) to (k).

At the first half of a first operating cycle, at first, the first X address strobe signal $\overline{RAS}(1)$ falls (enters into the set state), when the first X address signal X1 is taken into the input buffer circuit 4. Next, the first Y address strobe signal $\overline{CAS}(1)$ falls (enters into the set state), when the first Y address signal Y1 is taken into the input buffer circuit 4 and the first Z address signal Z1 is taken into the input buffer circuit 23. Then, the X and Y address signals X1 and Y1 are converted into the first address data AD1 in the input buffer circuit 4. This first address data AD1 is transmitted from the input buffer circuit 4 to the latch circuit 6 through the switch circuit 5 being switched on. On the other hand, the Z address signal Z1 is converted into four kinds of first Z address data ZAD1 in the input buffer circuit 23. The four first Z address data ZAD1 are transmitted from the input buffer circuit 23 to the latch circuits 26a to 26d through the output lines and the switch circuits 25a to 25d being switched on, respectively. When the address data AD1 is received by the latch circuit 6, the first clock signal CLK1 (1) falls (enters into the set state), then the switch circuit 5 is turned off after the first address data AD1 is latched in the latch circuit 6. This results in electrically insulating the input buffer circuit 4 from the latch circuit 6. When the Z address data ZAD1 is received by the latch circuits 26a to 26d, the feeding of the Z address data ZAD1 is terminated (The clock signal CLK1 drops). Hence, the switch circuits 25a to 25d are turned off after the latch circuits 26a to 26d latch the corresponding Z address data ZAD1, respectively. This results in electrically insulating the input buffer circuit 23 from the latch circuits 26a to 26d.

Next, during the second half of the first operating cycle, the first address data AD1 is fed from the latch circuit 6 to the memory circuit block 8, in which the first address data AD1 is decoded in the X decoder 9 and the Y decoder 10. In this case, the decoded output of the X decoder 9 operates to select one word line in the memory array 11 (two or more word lines if the memory array 11 is divided into two or more parts). The data for the selected word line is read out of the memory array 11 and output onto two or more columns of bit lines, for example, 1024 columns. The output data is amplified in the sense amplifier 12 and then is fed to the bit select switch 13. The decoded output of the Y decoder 10 is directly fed into the bit line select switch 13 for selecting a predetermined number of bit lines, herein, four bit lines. Next, each output data D1 on these selected four bit lines are respectively amplified in the buffer amplifiers 14a to 14d and then output from the memory circuit block 8. Then, these four output data D1 are transmitted to the corresponding latch circuits 16a to 16d through the switch circuits 15a to 15d being switched on, respectively. Likewise, the first Z address data ZAD1 of each of the latch circuits 26a to 26d is transmitted to the latch circuits 28a to 28d through the switch circuits 27a to 27d being switched on.

At the second half of the first operating cycle, the first X address strobe signal $\overline{RAS}(1)$ and the first Y address strobe signal $\overline{CAS}(1)$ both rise (enter into the reset state) so that the switch circuits 5 and 25a to 25d are switched on, thereby releasing the electrical insulating states of the latch circuits. At this time, the data has been read out of the latch circuits 6, 26a to 26d. Hence, the release of the insulating states does not have any adverse effect on the later I/O operation of the data.

When the second clock signal CLK2(1) falls (enters into the set state), the switch circuits 15a to 15d and the switch circuits 27a to 27d are turned off. As such, the four output data D1 are latched in the latch circuits 16a to 16d, respectively and the first Z address data ZAD1 is latched in the latch circuits 28a to 28d, respectively. Next, the four output data D1 stored in the latch circuits 16a to 16d and the first Z address data ZAD1 stored in the latch circuits 28a to 28d are fed to the corresponding one of the data selectors 20a to 20d. The content of the first Z address data ZAD1 determines the number of operative data selectors 20a to 20d being equal to the number of output bits (output data), herein, 1. The remaining data selectors (herein, 3 selectors) are made inoperative. As such, only the output data D1 passing through just one operative data selector is fed into the output buffer circuit 18.

Then, when the second clock signal CLK2(2) falls (enters into the set state), the foregoing operation to be done when the first, second clock signal CLK2(1) drops is executed, in which the output data D2 is read in place of the output data D1 and the second Z address data ZAD2 is read in place of the first Z address data ZAD1.

In turn, the description will be oriented to the second operating cycle, in which during the first half of the second operating cycle, the circuit components from the input buffer circuit 4 to the latch circuit 5 and from the input buffer 23 to the latch circuits 26a to 26d are operated in the similar manner to those circuit components operated in the first half of the first operating cycle. That is, at first, at the rise of the second X address strobe signal $\overline{RAS}(2)$, the second X address signal X2 is read by the input buffer circuit 4. Then, at the drop of the second Y address strobe signal $\overline{CAS}(2)$, the second Y address signal Y2 is read by the input buffer circuit 4 and the second Z address signal Z2 is read by the input buffer circuit 23. The second address data AD2 obtained from the address signals X2 and Y2 is transmitted from the input buffer circuit 4 to the latch circuit 6 through the switch circuit 5 being switched on. On the other hand, the four kinds of second Z address data ZAD2 obtained from the Z address signal Z2 are transmitted from the input buffer circuit 23 to the corresponding one of the latch circuits 26a to 26d through the output lines and the switch circuits 25a to 25d being switched on, respectively. When the second address data AD2 is read by the latch circuit 6, the address data AD2 is latched in the latch circuit 6. Then switch circuit 5 is switched off. On the other hand, when each Z address data ZAD2 is read by the corresponding one of the latch circuits 26a to 26d, each Z address data ZAD2 is latched in the corresponding one of the latch circuits 26a to 26d. Then each of the switch circuits 25a to 25d are switched off.

Further, in the second half of the second operating cycle, the circuit components from the latch circuit 6 to each of the latch circuits 16a to 16d and from each of the latch circuits 26a to 26d to each of the latch circuits 28a to 28d operate in a similar manner to those circuit components that operate in the second half of the foregoing first operating cycle. The second address data AD2 in the latch circuit 6 is decoded in the X decoder 9 and the Y decoder 10. The decoded output of the X decoder 9 operates to select one word line (or a plurality of word lines) from the word lines contained in the memory array 11. The data for the selected word line is read out of the memory array 11 and is output onto the plurality of bit line columns. Those output data are amplified in the sense amplifier 12 which feeds the output to the bit select switch 13. On the other hand, the decoded output of the Y decoder 10 is directly fed into the bit line select switch 13 for selecting a predetermined number, four, of bit lines from those bit line columns. Each output data D2 on those selected four bit lines is amplified in the buffer amplifiers 14a to 14d and is then transmitted to the corresponding one of the latch circuits 16a to 16d through the switch circuits 15a to 15d, respectively. Likewise, the second Z address data ZAD2 in each of the latch circuits 26a to 26d is transmitted to the corresponding one of the latch circuits 28a to 28d through the switch circuits 27a to 27d being set on.

Then, the description will be oriented to the third pipeline operating cycle, in which the first and the second halves of the third operating cycle are the same as those of the second pipeline operating cycle. Hence, the description thereof will be left out.

As described above, the switch circuit 5 and the latch circuit 6 are connected between the input buffer circuit 4 and the memory circuit block 8 and the switch circuits 15a to 15d and the latch circuits 16a to 16d are connected between the memory circuit block 8 and the output buffer circuit 18. Hence, during a period when the output data D1 for the first address data AD1 is read out of the output buffer circuit 18, the next output data D2 for the second address data AD2 is read out of the memory array 11 and the third address data AD3 may be taken by the input buffer circuit 4. This operation makes it possible to read the data from the memory array 11 at a shorter cycle than the normal memory access time and output it from the memory system.

According to the present embodiment, four output data read out of the memory circuit block 8 are fed into the corresponding four data selectors 20a to 20d together with the four kinds of Z address data. The Z address data operates to selectively activate only one of the four data selectors 20a to 20d. As such, it is possible to selectively output the same number (herein, 1) of output data as the output bits from the memory system.

To make the description clear, the present embodiment has been described on the assumption that the number of output data selected from the memory array 11 in response to the X and the Y address signals is 4 and the number of the output data selected in response to the Z address signal is 1. Those numbers are mere examples and do not at all limit the actual number of output data in the present invention. For example, the number of output data selected from the memory array 11 may be 16 and the number of output data may be four or eight. In place, various combinations of the numbers are made possible.

Further, the present embodiment has been described on the assumption that the Z address signal 2-bit signal and the four kinds of Z address data are generated. The number of bits contained in the Z address signal is a mere example and does not definitively limit the Z address signal in the present invention. In this case, the number of bits contained in the Z address signal is defined depending on the number of output bits (number of output data) as well as the number of data selectors (20a to 20d in this embodiment) and the number of output buffer circuits (18 in this embodiment). For example, when the number of used output bits is 1, number of the used data selectors is 8 and the number of used output buffer circuits is 1, the used Z address signal is a three-bit signal. In place, when the number of the used output bits is 4, the number of used data selectors is 8 and the number of used output buffer circuits is 4, the used Z address signal is a 1-bit signal. It goes without saying that other combinations are possible.

Moreover, the present embodiment has been described to use the address transition detector (ATD) circuit 24 for controlling the latch and the through states of the Z address. However, the use of the address transition detector 24 is not limited to the above description. For example, the address transition detector circuit 24 may be used for controlling the latch and the through state of the X and the Y address data in addition to the Z address data. Conversely, in place of using the address transition detector circuit 24 for controlling the latch and through of the Z address data, the first clock signal CLK1 may be used.

Figure 3:
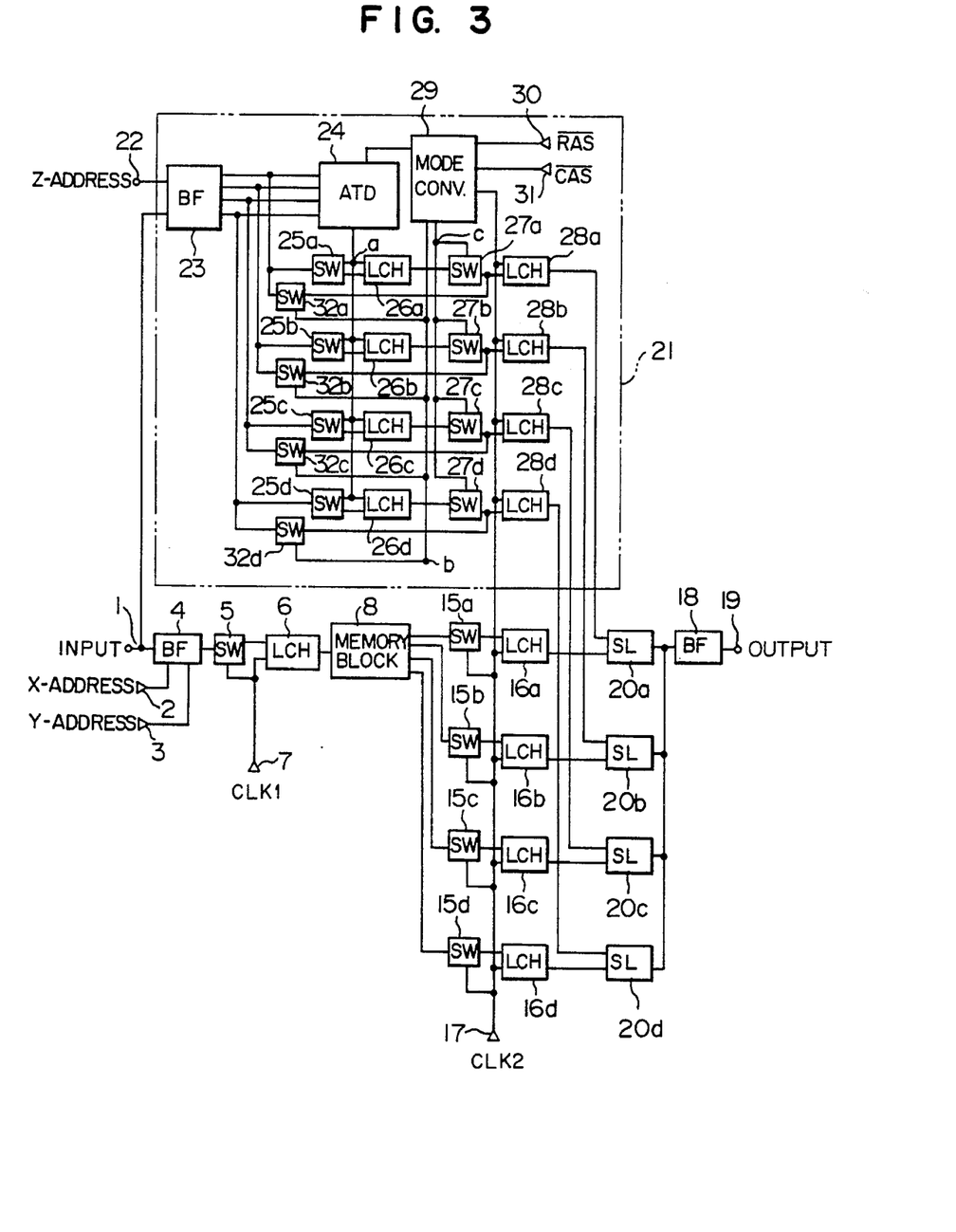
FIG. 3 is a block diagram showing a pipeline-operating type memory system according to a second embodiment of the present invention.

Turning to FIG. 3, which is a block diagram showing a pipeline-operating type memory system according to the second embodiment of the invention, in this embodiment, the memory array is made of a dynamic RAM and is operated in a pipelining manner at a fast page mode.

In FIG. 3, a numeral 29 denotes a mode switch circuit. A numeral 30 denotes an input terminal for an X address signal. A numeral 31 denotes an input terminal for a Y address signal. Numerals 32a to 32d denote switch circuits. The other components are referenced by the same reference numbers as the components shown in FIG. 1.

The mode switch circuit 29 receives the X address strobe $\overline{RAS}$ and the Y address strobe $\overline{CAS}$ through the X address signal input terminal 30 and the Y address signal input terminal 31, respectively. The switch circuit 32a is connected in parallel to the serial connection of the switch circuit 25a, the latch circuit 26a and the switch circuit 27a. The switch circuit 32a is arranged to selectively bypass those circuits. The other switch circuits 32b to 32d have the similar arrangements. Further, the switch circuits 32a to 32d and the latch circuits 26a to 26d are controlled in response to a signal fed from an output node a of the address transition detector circuit 24, while the switch circuits 32a to 32d are controlled in response to a signal fed from an output node b of the mode switch circuit 29 and the switch circuits 27a to 27d are controlled in a signal fed at the output node c of the mode switch circuit 29.

Figure 4:
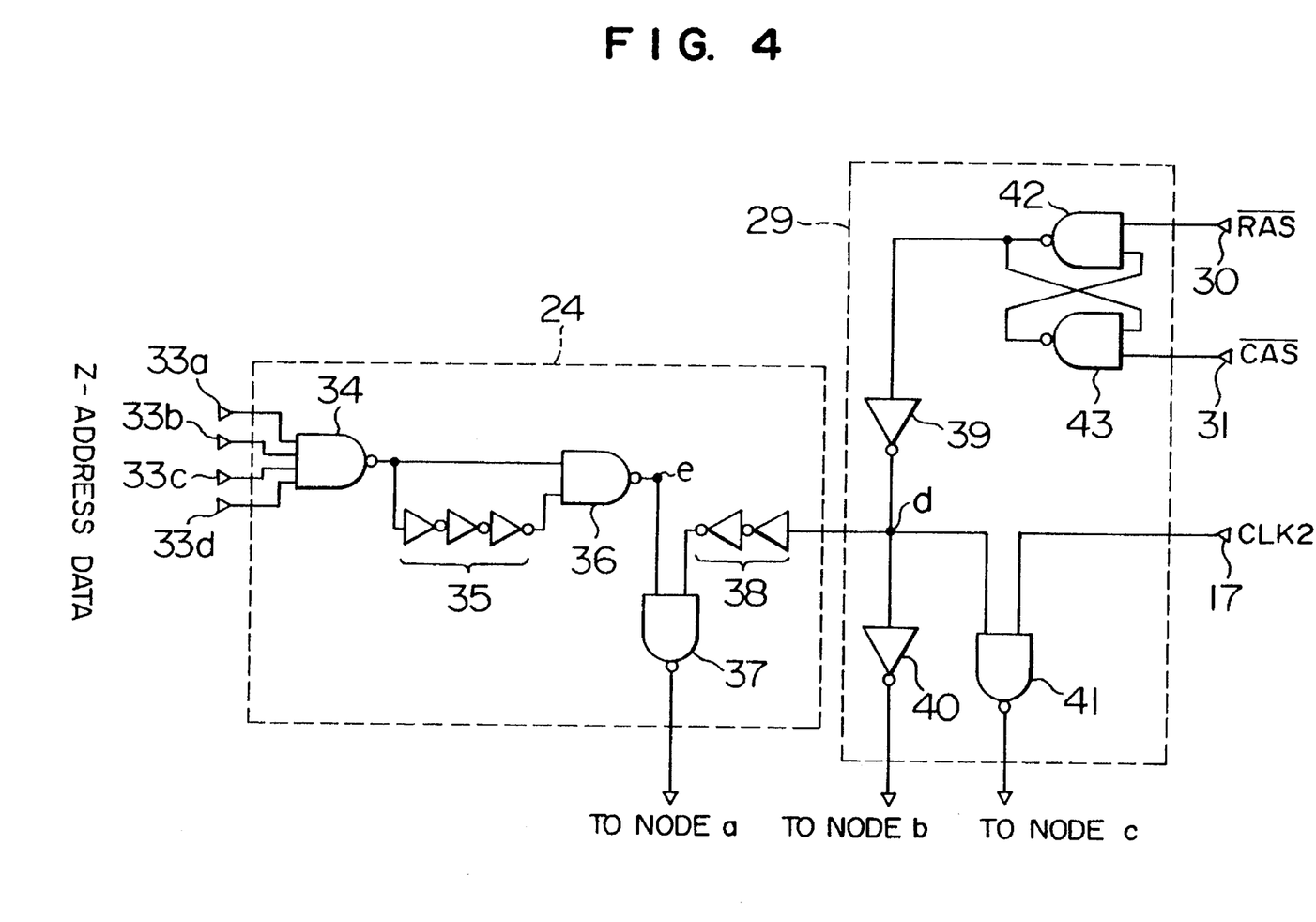
FIG. 4 is a circuit diagram showing an address transition detector and a mode switching circuit in detail.

FIG. 4 is a circuit diagram showing the inside circuits of the address transition detector circuit and the mode switch circuit used in the second embodiment.

In FIG. 4, numerals 33a to 33d denote input terminals for four kinds of Z address data. Numerals 34, 36, 37, 41, 42, 43 denote NAND gates. Numerals 35 and 38 denote a delaying inverter chain. Numerals 39 and 40 denote inverters. Other components are the same as those shown in FIG. 1 and have the same reference numbers.

The output of the address transition detector circuit 24 is connected to the node a (see FIG. 3) and two outputs of the mode switch circuit 29 are connected to the node b (see FIG. 3) and the node c (see FIG. 3), respectively.

Figure 5:
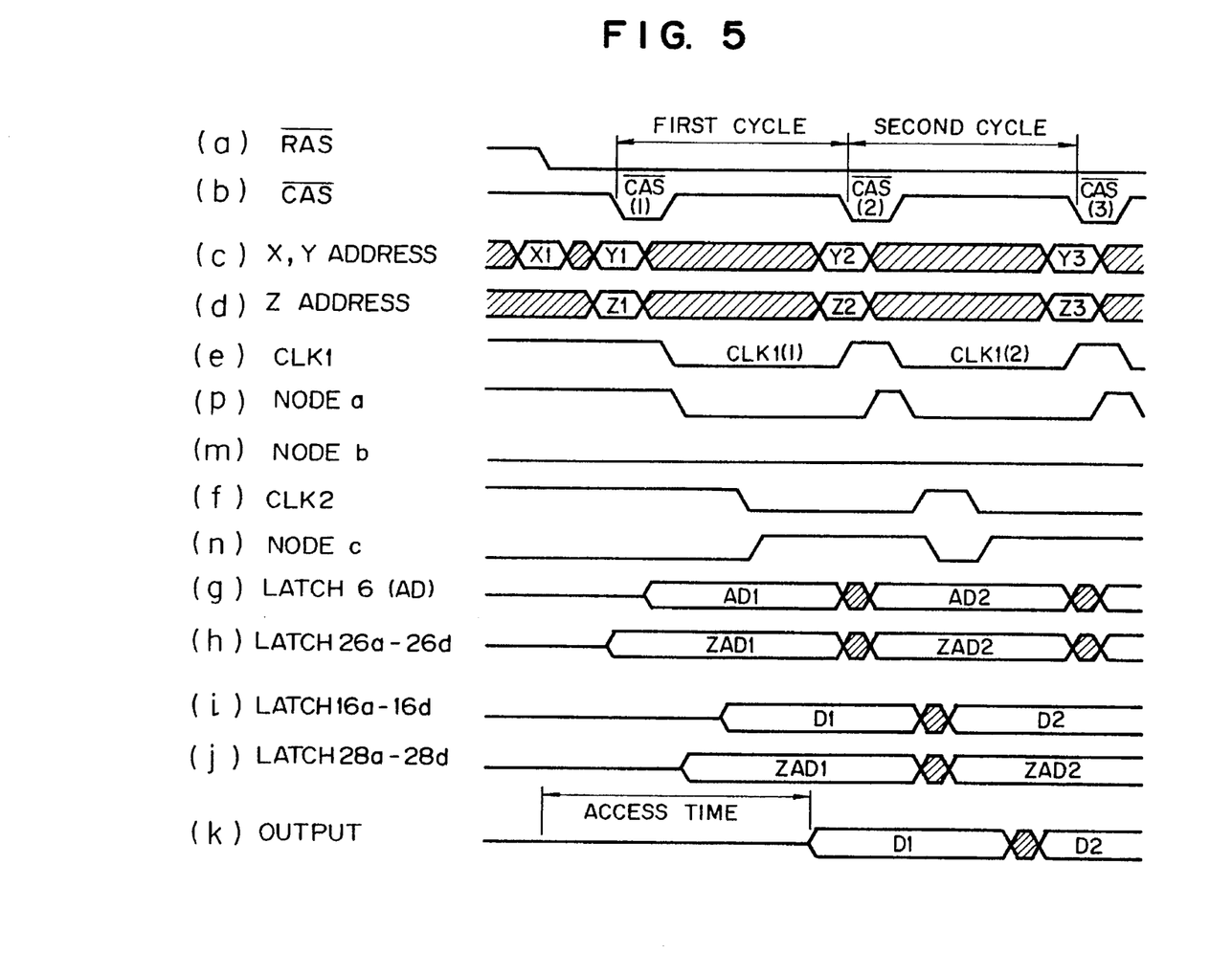
FIG. 5 is a waveform view showing how the pipeline-operating type memory system according to the second embodiment operates at a fast page mode.

In turn, FIG. 5 is an explanatory view showing signal states and signal-feeding timings in each component of the memory system according to the second embodiment of the invention. Those illustrated states and timings are those at a fast page mode.

In FIG. 5, (P) indicates a waveform of a potential at the node a. (m) indicates a waveform of a potential at the node b. (n) indicates a waveform of a potential at the node c. The other reference symbols indicate the same signals as those shown in FIG. 2.

Herein, the operation of the second embodiment will be described as referring to FIGS. 4 and 5.

In the normal operating mode, the first clock signal CLK1 and the second clock signal CLK2 are held in the reset (high-level) state. As such, the switch circuits 5 and 15a to 15d are held on and the latch circuits 6 and 16a to 16d are unlatched. The outputs of the address transition detector circuit 24 and the mode switch control 29 are both at a high level. Further, the nodes a, b and c keep their potentials at high level. Hence, the switch circuits 25a to 25d and 32a to 32d are both held on and the latch circuits 26a to 26d and the latch circuits 28a to 28d are unlatched. The switch circuits 27a to 27d are held on when the control signal is at low level and are held off when the control signal is at high level, unlike the other switch circuits.

As such, in the normal operating mode, that is, when the X address strobe signal $\overline{RAS}$ changes at each pipeline operating cycle and the Y address strobe signal $\overline{CAS}$ changes independently to the X address strobe signal $\overline{RAS}$ and between the change of the X address strobe signal $\overline{RAS}$, the address data AD1 passes through the switch circuit 5 and the latch circuit 6 as it is. The output data D1 fed from the memory array 11 passes through the switch circuits 15a to 15d and the latch circuits 16a to 16d as it is. The Z address data ZAD1 passes through the switch circuits 32a to 32d and the latch circuits 28a to 28d as it is and the output data D1 and the Z address data ZAD1 are applied into the data selectors 20a to 20d. In response, each of the data selectors 20a to 20d select just one output data depending on the content of the Z address data ZAD1 and the selected output data is output at the output terminal 19. At the second operating cycle, the foregoing operation is repeated.

Next, at a fast page mode, that is, when the X address strobe signal $\overline{RAS}$ is held low and the Y address strobe signal $\overline{CAS}$ changes at each pipeline operating cycle, like the first clock signal CLK1 and the second clock signal CLK2 in the foregoing first embodiment, the first clock signal CLK1 and the second clock signal CLK2 change at the same period as the pipeline operating cycle. In the mode switch circuit 29, therefore, the NAND gates 42 and 43 connected in a flip-flop manner for receiving the X address strobe signal $\overline{RAS}$ and the Y address strobe signal $\overline{CAS}$ enable the potential at the internal node d to be held high at the fast page mode, while the node b connected to the node d through the inverter 40 is held at low level as shown in FIG. 5(m). Likewise, one input of a two-input NAND gate 41 is fixed at a high level, that is, the potential at the node d. As shown in FIG. 5(n), the potential at the node c is made to be a waveform of a second clock signal CLK2. In the address transition detector circuit 24, one input of the two-input NAND gate 36 is fixed at high level, that is, the potential at the node d. Hence, the potential at the node a is defined depending on the other input of the two-input NAND gate 36. That is, the potential at the internal node e, which defines the potential at the node a, is held at high level when the NAND gate 36 waits for the Z address data ZAD1. Each time the Z address data ZAD1 is input, any one of the Z address data ZAD1 is held at low level. Hence, the potential at the internal node e changes from high level to low level. After the delaying time defined by the delaying inverter train 35 (see FIG. 4), the potential at the internal node e is returned from low level to high level. Since the period of the first clock signal CLK1 is the same as the period at which the Z address signal Z is read, the potential at the node a is made to have a signal waveform changing at the same period as the pipeline operating cycle.

At the fast page mode, each circuit component basically operates in the same manner as that in the first embodiment. The detailed description thereabout is eliminated from this specification. The different aspect from the operation of the first embodiment is that the first embodiment is arranged to control the switch circuits 27a to 27d in response to the second clock signal CLK2, while the present embodiment is arranged to control the switch circuits 27a to 27d based on the potential at the node c. As mentioned above, the waveform of the potential at the node c is equivalent to the inversed second clock CLK2. The present embodiment controls the switch circuits 27a to 27d in an inverting manner to the first embodiment which controls the switch circuits 27a to 27d. It means that the operation of the switch circuits 27a to 27d included in this embodiment is essentially similar to the operation of the switch circuits 27a to 27d included in the first embodiment.

At the normal mode, the second clock signal CLK2 used in this embodiment is fixed at high level. In the fast page mode, the second clock signal CLK2 is subject to a predetermined transition based on the transition of the Y address strobe signal $\overline{CAS}$. The second clock signal CLK2 can be produced by a logic unit for receiving the X address strobe signal $\overline{RAS}$ and the Y address strobe signal $\overline{CAS}$.

Figure 6:
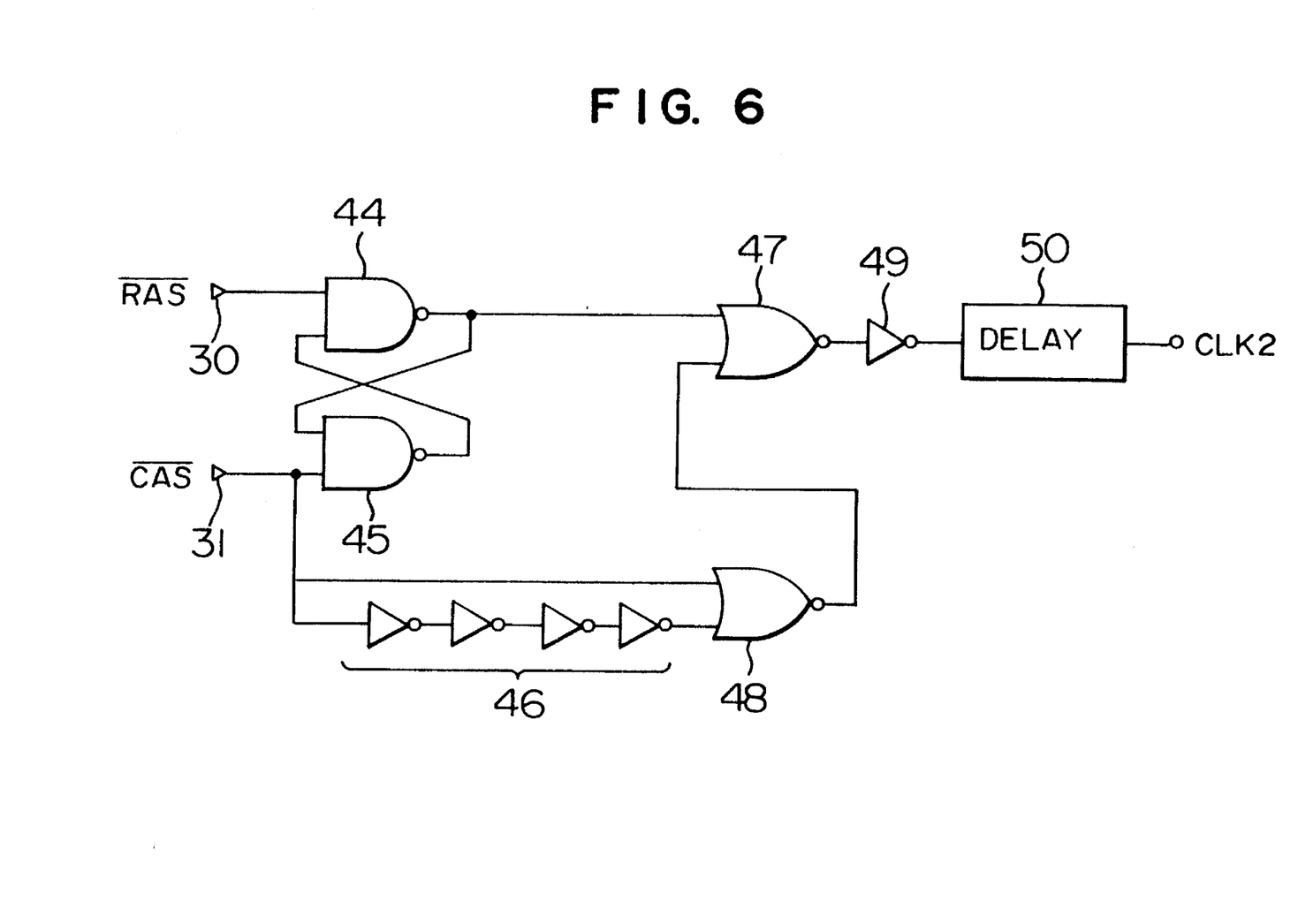
FIG. 6 is a circuit diagram showing an example of a clock signal generating circuit.

In FIG. 6, numerals 44 and 45 denote a pair of NAND gates connected in a flip-flop manner. A numeral 46 denotes a delaying inverter chain. Numerals 47 and 48 denote NOR gates. Numerals 49 and 50 denote delaying circuits.

The latch circuits 16a to 16d shown in FIGS. 1 and 3 can be replaced with a latch circuit disclosed in the U.S. application Ser. No. 890,260 filed on May 29, 1992 entitled "Memory System and Method of Reading Information" by Noboru AKIYAMA, et al and assigned to the present assignee, the content of which is incorporated by reference.

The memory system according to the present embodiment operates in a similar manner to the memory system according to the foregoing first embodiment at fast page mode. It is, therefore, obvious that this memory system may offer the same effect as the memory system according to the first embodiment. The present embodiment has been described to produce a second clock signal CLK2 from the X address strobe signal $\overline{RAS}$ and the Y address strobe signal $\overline{CAS}$ through the effect of the logic unit. Instead, the present invention may apply to a synchronous memory for receiving a first and a second clock signals CLK1 and CLK2 from the external. Further, in the first embodiment, the present invention applies to a dynamic RAM. In actuality, however, it goes without saying that the present invention may also apply to a static RAM.

It is to be understood from the above description that the present invention makes it possible for the pipeline-operating type memory system to directly perform a multi-bit test when performing a logic test about a newly manufactured memory LSI. The memory system according to the present invention consumes half or quarter as short a time as the conventional memory system when performing a logic test.

The memory system according to the present invention provides the capability of easily meeting with a request for changing the number of output bits. For example, when designing two kinds of memory systems having four and eight output bits (output data), the number of data read out of the memory array specified by the X and Y addresses is assumed to be 16, and provided with the sixteen data selectors 20a–20d and eight output buffer circuits 18. For the four output bits, the memory system is just arranged to provide that the Z address is 2-bit, and used with the four output buffer circuits 18 among the eight. For eight output bits, the memory system is just arranged to provide that the Z address is 1-bit, and used with eight output buffer circuits 18 of all. That is, the present invention may eliminate the troublesome work of newly designing a decoder circuit and a bit line select switch for each of the output bits and thereby greatly reduce the number of steps of designing the memory system.

What is claimed is:

1. A pipeline-operating type memory system, including latch means, for fixing at least an X address and alternately setting said latch means into a latching state and a through state in a manner to suit a pipeline operating cycle at a fast page mode for transferring data for any Y address according to an address strobe signal and to output at least one piece of data, said pipeline-operating type memory system comprising:

first input means for receiving a selector address signal for selecting data;

first means for latching said selector address signal output from said first input means by means of a first signal, controlling said latching state on control signals generated according to said address strobe signal, latching said selector address signal by means of a second signal, and outputting said selector address signal until said selector address signal is no longer in the latching state;

second input means for receiving at least said address strobe signals, an X address signal and a Y address signal, both of said X address signal and said Y address signal being used for selecting said data;

second means for latching said X and Y address signals by means of said first signal, and continuously feeding at least one piece of said data selected by at least said X address signal and Y address signal;

third means for latching said data from said second means by means of said second signal and continuously feeding at least said data until said data is no longer in the latching state; and selector means for temporarily holding data from said third means, being selectively activated according to a pipeline operating cycle and a number of bits contained in said selector address signal output from said first means.

2. A pipeline-operating type memory system as claimed in claim 1, wherein said first means includes:

an address transition detector circuit for outputting said first signal each time said selector address signal changes, a mode switch circuit for outputting a first control signal and a second control signal in response to said address strobe signal, first latch circuits for latching said selector address signal by means of said first signal and continuously feeding at least said selector address signal until said selector address signal is no longer in the latching state, and second latch circuits for latching said selector address signal from said first latch circuit by means of said second signal and continuously feeding at least said selector address signal until said selector address signal is no longer in the latching state.

3. A pipeline-operating type memory system as claimed in claim 2, wherein said mode switch circuit serves to generate said second signal from an X address strobe signal and a Y address strobe signal.

4. A pipeline-operating type memory system as claimed in claim 3, wherein said X address strobe signal is held low at fast page mode and said Y address strobe signal changes at each pipeline operating cycle.

* * * * *